United States Patent
Mitchell et al.

(10) Patent No.: US 7,202,112 B2
(45) Date of Patent: Apr. 10, 2007

(54) MICRO LEAD FRAME PACKAGES AND METHODS OF MANUFACTURING THE SAME

(75) Inventors: Craig S. Mitchell, San Jose, CA (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/972,180

(22) Filed: Oct. 22, 2004

(65) Prior Publication Data

US 2006/0099789 A1 May 11, 2006

(51) Int. Cl.
*H01L 21/50* (2006.01)
*H01L 23/495* (2006.01)

(52) U.S. Cl. ............................ 438/123; 257/672
(58) Field of Classification Search ........ 257/668–672, 257/690–693; 438/111, 123, 411, 461, 611–613
See application file for complete search history.

(56) References Cited

U.S. PATENT DOCUMENTS

| | | | |
|---|---|---|---|
| 5,122,860 A | 6/1992 | Kikuchi et al. | |
| 5,157,475 A | 10/1992 | Yamaguchi | |
| 5,157,480 A | 10/1992 | McShane et al. | |
| 5,406,028 A | 4/1995 | Beng et al. | |
| 5,428,248 A | 6/1995 | Cha | |
| 5,466,888 A | 11/1995 | Beng et al. | |
| 5,608,265 A | 3/1997 | Kitano et al. | |
| 5,610,436 A | 3/1997 | Sponaugle et al. | |
| 5,679,977 A | 10/1997 | Khandros et al. | |
| 5,693,573 A | 12/1997 | Choi | |
| 5,863,805 A | 1/1999 | Chiang | |
| 5,866,939 A | 2/1999 | Shin et al. | |
| 5,886,404 A | 3/1999 | You | |

(Continued)

FOREIGN PATENT DOCUMENTS

JP 3-94459 A1 4/1991

(Continued)

OTHER PUBLICATIONS

Suhir, E., "Die Attachment Design and Its Influence on Thermal Stresses in the Die and the Attachment," 1987 Proceedings 37th Electronic Components Conf., May 11-13, 1978, pp. 508-517.

(Continued)

*Primary Examiner*—Calvin Lee
(74) *Attorney, Agent, or Firm*—Lerner, David, Littenberg, Krumholz & Mentlik, LLP

(57) ABSTRACT

A method of making a microelectronic package includes providing a lead frame having at least one bus element and a plurality of branches extending from the bus element, each branch including a terminal and an elongated lead extending between the bus element and the terminal. The method includes applying a carrier element to the lead frame to form a laminate with the branches adhering to a first surface of the carrier element, and severing the branches from the bus element, leaving the branches mechanically connected to one another by the carrier element so as to form an in-process unit. The method also includes assembling a microelectronic element with the in-process unit so that the microelectronic element overlies a second surface of the carrier element.

22 Claims, 9 Drawing Sheets

U.S. PATENT DOCUMENTS

| | | |
|---|---|---|
| 5,963,433 A | 10/1999 | Kim |
| 5,998,877 A | 12/1999 | Ohuchi |
| 6,118,174 A | 9/2000 | Kim |
| 6,150,709 A | 11/2000 | Shin et al. |
| 6,204,553 B1 * | 3/2001 | Liu et al. .................... 257/676 |
| 6,246,117 B1 | 6/2001 | Ichinose |
| 6,427,976 B1 | 8/2002 | Huang et al. |
| 6,545,364 B2 | 4/2003 | Sakamoto et al. |
| 6,590,281 B2 | 7/2003 | Wu et al. |
| 6,635,957 B2 | 10/2003 | Kwan et al. |
| 2001/0031553 A1 * | 10/2001 | Corisis ...................... 438/666 |
| 2003/0057542 A1 | 3/2003 | Frezza et al. |
| 2004/0100772 A1 * | 5/2004 | Chye et al. ................. 361/702 |

FOREIGN PATENT DOCUMENTS

| | | |
|---|---|---|
| JP | 5-129473 | 5/1993 |

OTHER PUBLICATIONS

Suzuki, K. et al., "Silicone Die Bond Adhesive and Clean In-Line Cure for Copper Lead Frame," IEEE Transactions on Components, Hybrids and Mfg. Tech., vol. 13, No. 4, Dec. 1990.

* cited by examiner

MICRO LEAD FRAME PACKAGES AND METHODS OF MANUFACTURING THE SAME

FIELD OF THE INVENTION

The present invention relates to microelectronic packages and methods of manufacturing such packages.

BACKGROUND OF THE INVENTION

Microelectronic elements such as semiconductor chips ordinarily are provided in packages which physically and chemically protect the microelectronic element itself, and which facilitate mounting and electrical connection of the microelectronic element to a larger circuit. For example, semiconductor chips typically are flat bodies having generally planar front and rear surfaces, with contacts disposed on the front surface connected to the internal electrical circuitry of the chip itself. Semiconductor chips typically are provided in packages which enclose the chip and which define terminals electrically connected to the contacts of the chip itself. By placing the package on a circuit panel and connecting the terminals to the circuit panel, the chip can be mounted and connected to the circuit. One type of chip package, referred to herein as a "carrier package," utilizes a dielectric element which has a very small circuit board or flexible circuit panel with metallic terminals and leads formed in place on the circuit panel. Typically, the chip is mounted on the dielectric so that the chip overlies a top surface of the dielectric, with the front or rear surface of the chip facing downwardly toward the dielectric, and the terminals are exposed at a bottom surface of the dielectric. An encapsulant may cover the chip and the top surface of the dielectric.

Typically, the metallic terminals and leads of a carrier package are extremely thin metal strips, typically no more than 50 microns thick. Such strips can be formed either by selectively depositing a metal such as copper on the dielectric, or by applying a layer of metal to the dielectric and then etching the layer to leave the strips. These thin structures, as a whole, are not self-supporting; although small portions of the leads may project beyond edges of the dielectric or over holes in the dielectric, at least the major portion of each lead is intimately bonded to the dielectric and relies upon the dielectric for structural supporting during processing and during service.

Carrier packages can be provided in numerous forms, including chip scale packages having dimensions in the horizontal directions, parallel to the front and rear surfaces of the dielectric, only slightly larger than the corresponding dimensions of the chip itself. Certain chip size carrier packages can be made with the terminals arranged in an "area array" so that the terminals are distributed in an array spread out over a substantial portion of the area of the bottom surface of the dielectric, rather than being disposed in only one or two rows. The area array arrangement provides larger spacing distances between adjacent terminals. Also, as shown, for example, in certain embodiments of U.S. Pat. No. 5,679,977, such a package may allow movement of the terminals relative to the chip. When the package is mounted to a circuit board, the terminals may be bonded to the corresponding contact pads of the circuit board as, for example, by solder balls. Movement of the terminals relative to the chip can compensate for differential thermal expansion and contraction of the chip and circuit board during manufacture and during service. This, in turn, reduces stress and strain in the bonds and thus enhances the reliability of the system.

Another principal type of microelectronic package is commonly referred to as a "lead frame" package. A lead frame package begins with a self-supporting metallic element referred to as the "lead frame" incorporating terminals and strips of relatively thick metal connecting the terminals to bus bars formed integrally with the strips and terminals. Such a lead frame may be fabricated by conventional metal working processes using dies to punch out unwanted areas from a metal sheet, or by etching a metal sheet. The lead frame is assembled with a microelectronic element such as a semiconductor chip, and the contacts of the chip are connected to individual metallic strips so that the metallic strips serve as leads connecting the contacts of the chip to the terminals. The resulting assembly is then encapsulated, typically by applying a protective material referred to as an "overmold," leaving the bus bars and portions of the strips adjacent the bus bars projecting from the overmolding. The bus bars are then removed. In some lead frame packages, relatively large portions of the strips project from the overmold, and the bus bar removal process is conducted so as to leave these large portions projecting substantial distances from the overmold. The ends of the strips remote from the overmold constitute the terminals. Packages formed in this manner typically are substantially larger than the chip itself. In a variant of this process, the projecting portions of the strips may be bent inwardly so that they extend underneath the bottom surface of the overmold.

As shown in U.S. Pat. Nos. 5,428,248 and 5,963,433, lead frame packages can be made using a lead frame with strips having chip connection ends and terminals projecting inwardly from bus bars positioned on opposite sides of a central space, and with terminals provided at the inner ends of these leads. The chip is positioned above the inwardly projecting leads, typically with the front face facing upwardly and connected to the leads by wire bonds. In this arrangement, the leads "fan-in" or extend inwardly, towards the center of the package, from the point of connection with the wire bonds to the terminals. After overmolding, the outer ends of the leads are removed as by punching the assembly using a die to break off the outer ends at the outer edges of the overmolding. The resulting package has the terminals disposed beneath the chip, and hence is relatively compact. Such a package, however, typically accommodates only two or four rows of terminals. As shown, for example, by U.S. Pat. Nos. 5,998,877; 5,863,805; and 6,427,976, the lead frame may be fabricated with leads projecting into the central space from bus bars on opposite sides of the central space. The chip is mounted with the front or contact-bearing face facing toward the leads, and wire bonds are applied to connect the chip contacts to the inner ends of the leads. Here again, the assembly is overmolded, leaving the outer ends of the leads and bus bars outside of the area covered by the overmold. The outer ends of the leads are removed, as by punching or shearing the assembly. Portions of the leads within the area covered by the overmold are exposed at the bottom surface of the overmold and serve as terminals for the package. In these arrangements, the leads "fan-out" from the point of connection with the wire bonds to the terminals; that is, the terminals are further from the center of the package than the points of connection to the wire bonds. This arrangement can be used with chips having contacts disposed in one or more rows adjacent the center of the chip.

Shin et al., U.S. Pat. No. 5,866,939 and Kim, U.S. Pat. No. 6,118,174 disclose variants of the "fan-in" approach, in which the terminal ends of the leads are disposed in an area array disposed wholly or partially beneath the chip. Here again, the leads are initially provided in lead frames with the leads projecting inwardly from bus bars into a central opening or space. In these arrangements as well, however, the outer ends of the leads are removed by punching or shearing after connection of the chip and encapsulation, so that the leads necessarily include stubs projecting beyond the wire bond to the outer periphery of the overmolding. These stubs can affect the electrical performance of the packaged semiconductor chip, particularly where the chip is operated with signals at high frequencies. The stubs serve as small antennas which may radiate the signals sent along the leads, or which may receive interfering signals.

Additionally, during the overmolding process, considerable care must be taken to avoid covering the terminal ends of the leads with the overmolding. Typically, the leads must have vertical bends or offsets along their length, so that the terminals are disposed at a selected vertical distance below the chip. This allows the overmolding to be applied below the chip. Even where this approach is taken, however, the mold must be carefully constructed and operated to avoid covering the terminal ends of the lead with the overmolding.

Additionally, some chip-size and near chip-size lead frame packages encounter mechanical difficulties such as high internal stresses at boundaries between the leads and the overmolding, and high stresses applied to the solder or other bonds used to connect the terminals ends of the leads to the circuit board.

Thus, despite the considerable effort devoted in the art heretofore to development of lead frame packages and methods of making the same, further improvements would be desirable.

SUMMARY OF THE INVENTION

One aspect of the invention provides a microelectronic package. The package according to this aspect of the invention desirably includes a microelectronic element having contacts and a dielectric element, at least a portion of the dielectric element extending beneath the microelectronic element. The package according to this aspect of the invention desirably also includes a structure including portions of a lead frame. This structure desirably includes a plurality of terminals and leads formed integrally with the terminals. At least some of the terminals and at least some of the leads are disposed entirely beneath the microelectronic element, and at least some of the contacts on the microelectronic element are connected to at least some of the terminals by at least some of the leads. Most preferably, the leads and terminals desirably are derived from portions of a lead frame by a process as discussed below.

A further aspect of the invention provides a method of making a microelectronic package. A method according to this aspect of the invention desirably includes the step of providing a lead frame including at least one bus element and a plurality of branches extending from the bus element. Each such branch desirably includes a terminal and an elongated lead extending between the bus element and the terminal. The method further includes the step of applying a carrier element to the lead frame to form a laminate, with the branches adhering to the carrier element, and then severing the branches from the bus element, leaving the branches mechanically connected to one another by the carrier element so as to form an in-process unit. The in-process unit may be subsequently assembled with a microelectronic element. This assembly step may be performed so that the microelectronic element overlies at least some of the leads and terminals. The severing step may include punching the laminate so as to remove portions of the lead frame.

A further aspect of the invention provides a microelectronic package including a microelectronic element having front and rear surfaces and edges extending between these surfaces, and having contacts exposed at the front surface. The package according to this aspect of the invention desirably also includes a substantially planar structure which includes portions of a lead frame. The substantially planar structure includes a plurality of terminals and leads formed integrally with the terminals. Most preferably, at least some of the terminals and at least some of the leads are disposed at least partially beneath the microelectronic element with one of the surfaces of the microelectronic element facing downwardly toward this structure. At least some of the contacts of the microelectronic element are connected to at least some of the terminals by at least some of the leads. The structure according to this aspect of the invention desirably includes an encapsulant at least partially covering the edges of the microelectronic element. Most preferably, the package also includes a dielectric element extending beneath the microelectronic element, and at least some of the leads and terminals are attached to the dielectric element.

DETAILED DESCRIPTION OF THE PREFERRED EMBODIMENTS

Figure 1:
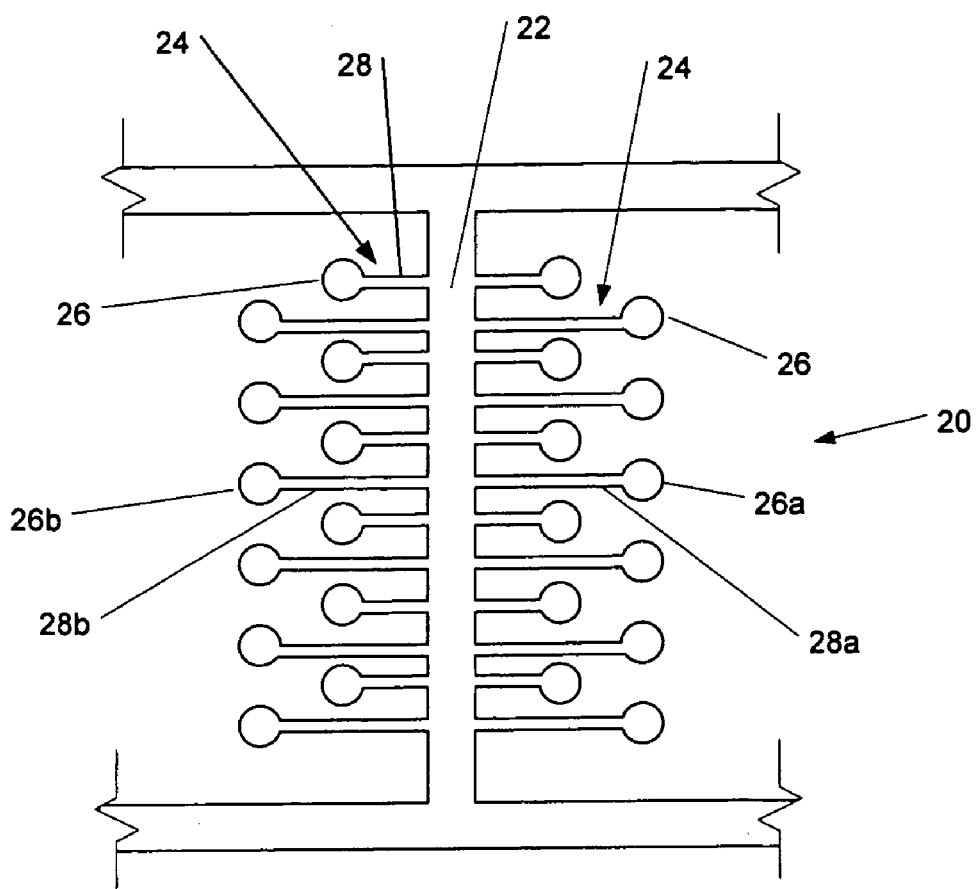
FIG. 1 is a diagrammatic plan view depicting a lead frame utilized in one embodiment of the invention.

A process in accordance with one embodiment of the present invention utilizes a lead frame 20 (FIG. 1). The lead frame includes a bus element 22 and a plurality of branches 24 projecting from the bus element. Each branch 24 includes a terminal 26 and an elongated lead 28 in the form of a metallic strip extending from the bus element 22 to the terminal 26. In the particular embodiment shown, bus element 22 is in the form of an elongated strip, and the branches 24 extend from opposite sides of the strip. The branches 24 are depicted as straight elements simply for clarity of illustration; in practice, the branches may extend in essentially any pattern. Also, terminals 26 are depicted as being disposed in two rows on each side of bus element 22, but any number of terminals may be used. In the embodiment depicted, each terminal 26 is connected to a lead 24 extending in only one direction from the terminal. For example, terminal 26a is connected to lead 28a, which extends in a first direction (to the left in FIG. 1), but terminal 26a is not connected to any conductive structure extending in the opposite, or second, direction (to the right in FIG. 1). Similarly, terminal 26b is connected to a lead 28b extending in a first direction relative to the terminal (to the right in FIG. 1), but terminal 26b is not connected to any conductive structure extending in the opposite, second direction from the terminal.

In this embodiment, lead frame 20, and particularly leads 28 and terminals 26, are substantially flat. That is, the upper surface of the lead frame, facing toward the viewer in FIG. 1, lies substantially in a single plane. The leads do not include vertical bends or jogs. Portions of the lead frame optionally may differ in thickness; as depicted in elevation (FIG. 3) terminals 26 are slightly thicker than leads 28. Use of a substantially flat lead frame greatly simplifies manufacture of the lead frame.

Lead frame 20 desirably is a self-supporting structure. That is, the lead frame itself can be supported by supporting bus element 22 in normal gravity, with the lead frame in a flat orientation, with the bus element 22 and branches 24 extending generally horizontally in the gravitational frame of reference, without permanently deforming the lead frame and with the lead frame maintaining physical coherence. Typically, lead frame 20 is formed from one or more electrically-conductive metals as, for example, copper or copper-based alloys. The lead frame may be formed by conventional processes normally used in fabrication of lead frames as, for example, etching a metallic sheet, mechanical working of a metallic sheet as in a stamping or punching die, and combinations of these processes. Typically, the leads and terminals are more than about 50 microns thick, most commonly about 100 to about 200 microns thick, although this thickness will vary with the composition of the metal and the size of the lead frame.

Terminals 26 desirably have surfaces which are wettable by a bonding material to be used in assembly of the completed package. Where the completed package is to be bonded using a solder, the terminals 26 desirably have solder-wettable surfaces. Merely by way of example, such solder-wettable surfaces may be provided by plating the lead frame with gold or a gold-containing alloy so as to form a surface which is resistant to oxidation. Leads 28 desirably are not wettable by the bonding material. The leads may be treated to provide a wetting-resistant surface or, in the case of copper, may simply be allowed to oxidize during a storage or dwell period after fabrication, so as to provide a coating of a copper oxide. In other arrangements, the leads may be plated with a solder-resistant metal or covered by a polymeric film (not shown).

Figure 2:
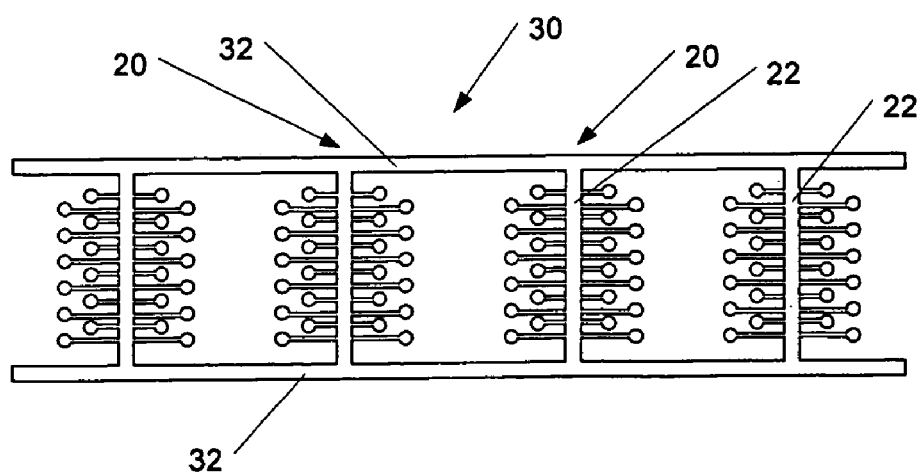
FIG. 2 is a diagrammatic plan view depicting a plurality of the lead frames shown in FIG. 1.

Preferably, the lead frame is fabricated in the form of a continuous or semi-continuous sheet or strip, such as a strip 30 (FIG. 2) having multiple lead frames 20 with their respective bus elements 22 connected to one another. In the strip 30, side members 32 connect the bus elements 22 of successive lead frames 20 with one another. The side members may be provided with elements such as sprocket holes (not shown) or other features to facilitate feeding and handling of the strip.

Figure 3:
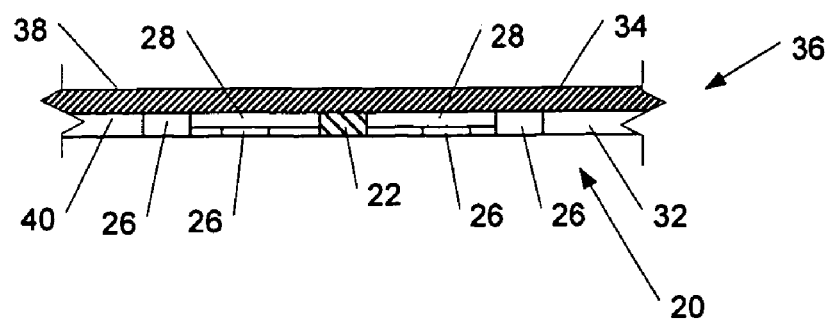
FIG. 3 is a diagrammatic sectional view depicting a laminate incorporating the lead frame of FIGS. 1 and 2.

In the next stage of the operation, each lead frame 20 is united with a carrier element 34, to form a structure referred to herein as a "laminate" 36, seen in sectional view in FIG. 3. In this embodiment, carrier element 34 is a dielectric element. Desirably, dielectric element 34 is a substantially flat, uniform structure having a top surface 38 and a bottom surface 40, and having a uniform thickness or distance between top and bottom surfaces 38 and 40. Most commonly, the thickness of the dielectric element is between about 10 and about 100 microns, although thicker or thinner elements may be employed. The dielectric element 34 includes one or more layers of dielectric material. Preferably, the dielectric layer 34, as a whole, is flexible. It may also be arranged to facilitate movement of terminals 26 in the completed package as discussed below. For this purpose, the dielectric layer may include one or more layers of a material having appreciable compliance under at least some conditions which will be encountered by the final assembly during manufacture or service. The degree of compliance provided by a given dielectric layer is a function both of the properties of the materials constituting the layer and the thickness of the layer. In some embodiments, dielectric element 36 may include, or consist entirely of, one or more layers of elastomers, foams, gels or other materials commonly regarded as being "soft" over a wide range of temperatures. Alternatively or additionally, the dielectric layer may include, or may consist of, one or more layers of materials such as thermoplastics or thermosetting polymers having elastic modulus which decreases substantially at temperatures which may be above room temperature but within the ranges encountered in service or under extreme thermal conditions which may be imposed by the environment or during manufacturing processes. For example, the materials used in the layer or layers may undergo a substantial reduction in elastic modulus and/or shear modulus at temperatures on the order of 100° C.

Preferably, the dielectric elements associated with the various lead frames are provided in a continuous sheet or roll, so that the dielectric elements may be united with the lead frames in strip 30 (FIG. 2) using a continuous or semi-continuous process such as feeding the dielectric elements and the strip of lead frames through a nip, as in a conventional laminating process. However, although the word "laminate" is used to describe the composite structure formed by the dielectric element and the lead frame, this should not be taken as limiting the process used to make the structure to a conventional laminating process. For example, the dielectric element may be formed in situ as by casting or extruding a layer of a liquid or pasty dielectric material and uniting the lead frames with the layer, and then subsequently setting the dielectric material to a solid form.

The bottom surface 40 of the dielectric element adheres to the confronting surfaces of lead frame 20. The bottom surface of the dielectric element may be coated with a separate layer of an adhesive (not shown). Alternatively, the adhesion may be provided by the materials constituting adjacent layers of the dielectric element. For example, where the dielectric element includes a settable material such as a thermoplastic or a curable thermoset such as a polyimide, and the dielectric material is not completely set at the time of lamination, adhesion may be provided by setting of the dielectric material. Also, the dielectric element 40 may include materials of the type commonly used as die attach adhesives, either as a coating overlying another dielectric layer or as the entirety of the dielectric element.

Figure 4:
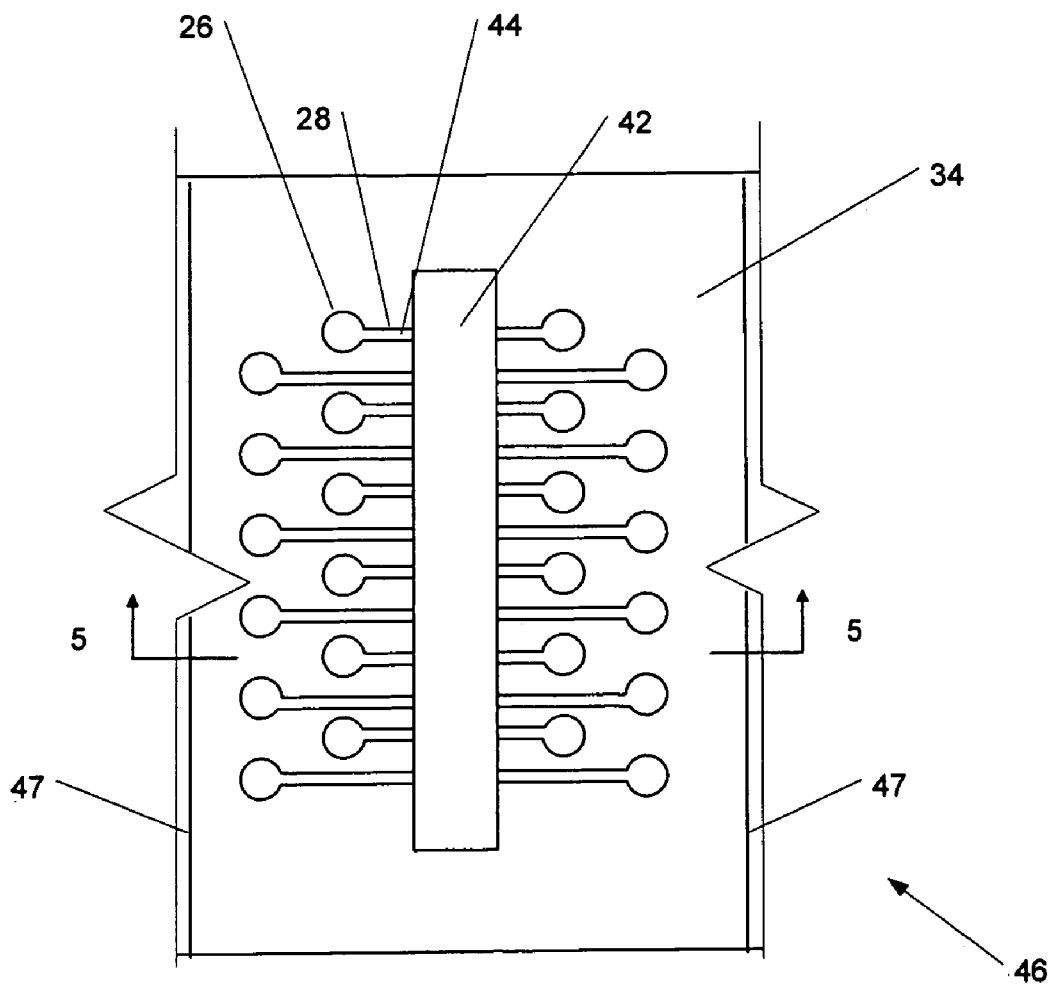
FIG. 4 is a diagrammatic plan view of an in-process element formed from the laminate of FIG. 3.
Figure 5:
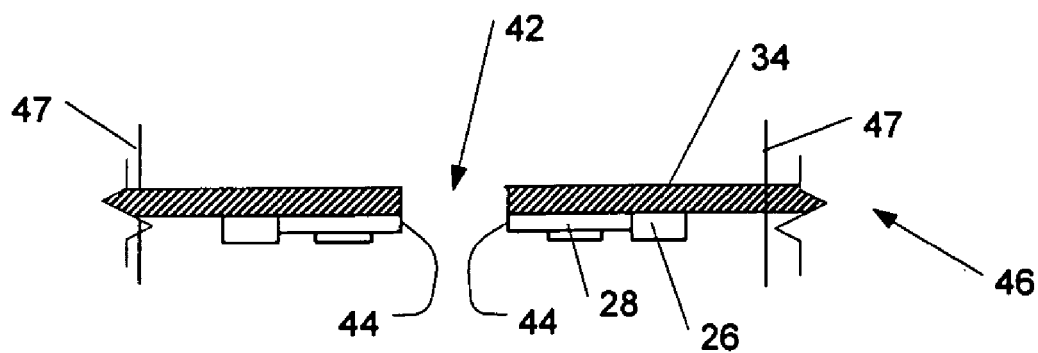
FIG. 5 is a sectional view taken along line 5—5 in FIG. 4.

In the next stage of the process, bus element 22 (FIGS. 1 and 3) is removed by punching the laminate. The punch cuts each lead 28 of the lead frame adjacent its juncture with the bus element and simultaneously forms a hole 42 (FIGS. 4 and 5) in the dielectric element 34. Inasmuch as the hole is formed by the same tool which cuts the leads, each lead 28 is automatically provided with an inner or contact end 44 disposed at an edge of the hole 42, such inner or contact end constituting the end of the lead opposite from the associated terminal 26. The punching operation desirably is performed while the laminate of lead frames and dielectric elements is still in the form of a continuous or semi-continuous strip, sheet or tape. Simultaneously with or after the punching operation, the side strips 32 which originally connected the lead frames to one another may be removed. Alternatively, the side strips may be left in place in the in-process unit 46 resulting from the punching operation.

The resulting in-process unit 46 retains the terminals and leads of the original lead frame, but the terminals and leads are now electrically disconnected from one another. The structure including the terminals and leads desirably remains substantially flat, without bends or jogs in the leads. The terminals and leads are held in place relative to one another and maintained as a coherent assembly by the dielectric element 34. The in-process units desirably are handled in the form of a continuous or semi-continuous strip, sheet or tape. In the particular configuration depicted in FIGS. 4 and 5, each in-process unit has a hole 42 in the form of an elongated slit disposed adjacent the center of the unit and has leads 28 extending in generally outward directions, away from the center of the unit towards the margins 47 of the dielectric element incorporated in the unit. At this stage of production, the margins 47 of the individual dielectric elements may or may not be visible, inasmuch as these margins are the boundaries between adjacent dielectric elements in the continuous sheet or tape. Each branch 24 has its outer-most extent at the terminal 26 of that branch. Stated another way, the leads 28 do not extend beyond the associated terminals 26 and do not extend to the margins of the dielectric element.

Figure 6:
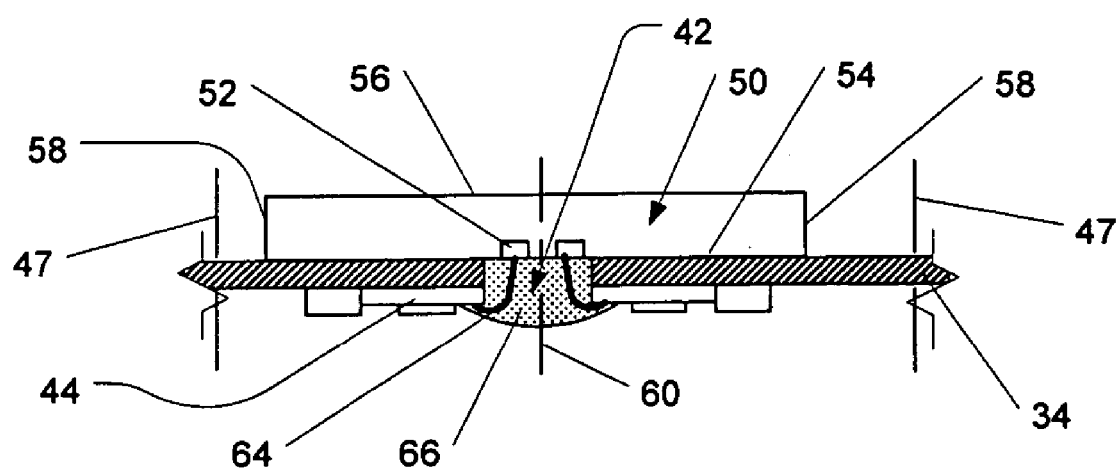
FIG. 6 is a view similar to FIG. 5, but depicting an assembly including the laminate together with a microelectronic element.

In the next stage of the process, each in-process unit 45 is united with a microelectronic element such as a semiconductor chip 50 (FIG. 6). Chip 50 has a front or contact-bearing surface 54, an oppositely-facing rear surface 56 and edges 58 extending between the front and rear surfaces. Contacts 52 are exposed at the front surface of the chip and lie close to a medial plane 60 of the chip, i.e., a plane equidistant between two oppositely-facing edges 58. The chip is placed on the top surface of dielectric element 34, with the front or contact-bearing surface 54 facing downwardly toward the dielectric element. Terminals 52 are aligned with the hole 42 in the dielectric element. Terminals 52 are connected as by conventional wire bonds 64 to the contacts ends 44 of the leads 28. The contact ends of the leads and the wire bonds 64 are covered by a bond encapsulant 66 as, for example, a curable silicone gel or other material which is soft, or which becomes soft during service, so that the encapsulant does not substantially impede flexibility of the wire bonds 64. The front face 54 of the chip may be bonded to the confronting top surface of dielectric layer 34 as, for example, by a die bond adhesive (not shown). Here again, the die bond adhesive 34 may be provided as a separate layer (not shown), or the adhesion may be provided by the layer of dielectric element 34 defining the top surface of the dielectric element as, for example, where such layer is a partially uncured or other settable layer.

The processes used to mount the chips perform the wire-bonding operation and apply the bond encapsulant may be similar to those used in assembly of carrier-type packages. Here again, the dielectric elements, and hence the in-process units, desirably remain in the form of a continuous or semi-continuous sheet, strip or tape during the chip-mounting procedure.

Figure 7:
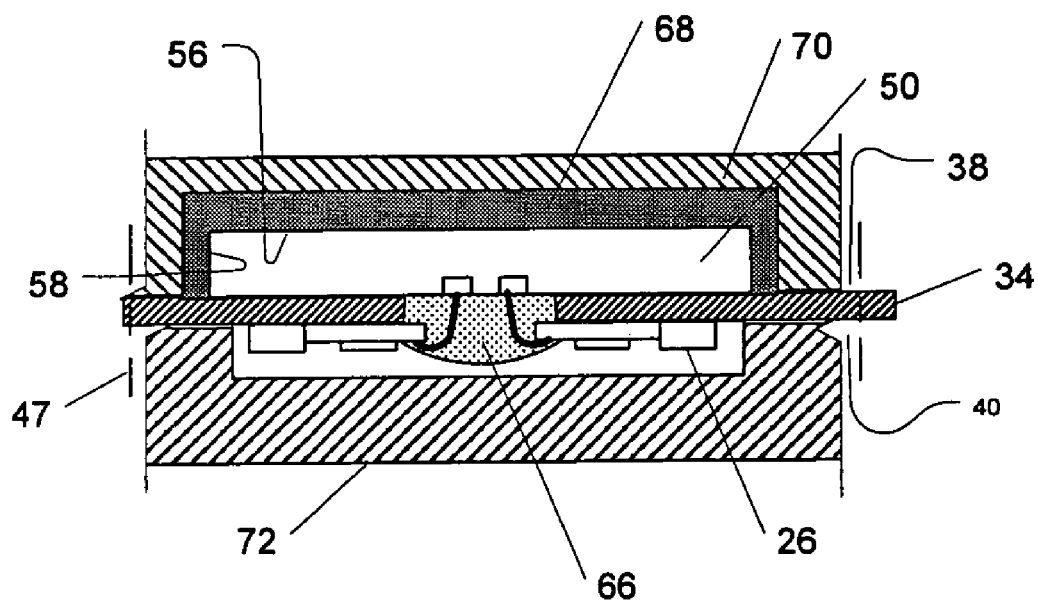
FIG. 7 is a sectional view depicting the assembly of FIG. 6 during a later processing stage.
Figure 8:
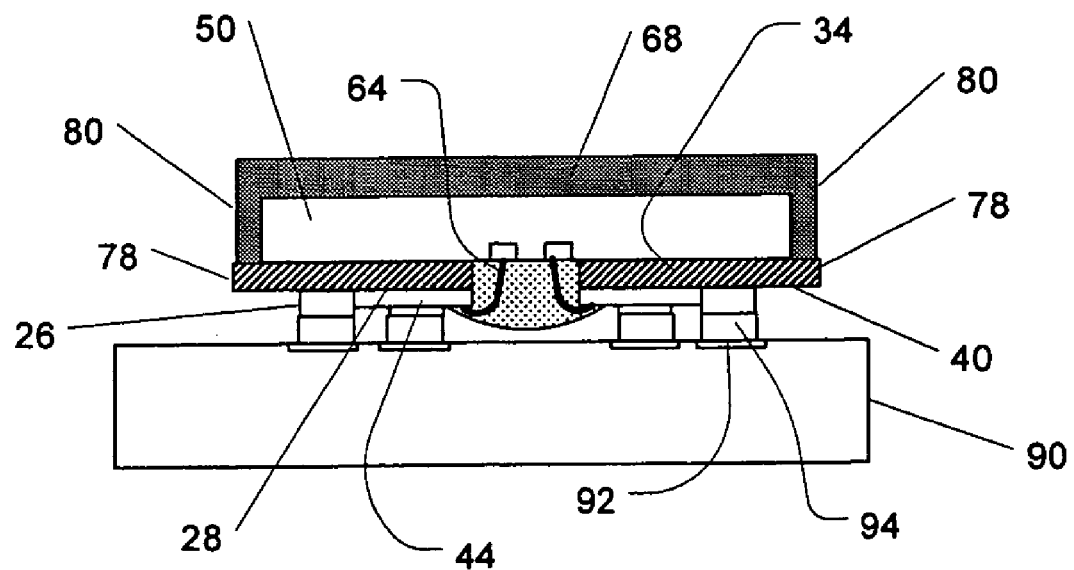
FIG. 8 is a sectional view depicting the package formed from the elements shown in FIGS. 1–7 in conjunction with a circuit panel.

After mounting the chip 50, and desirably after application of the wire bonds and bond encapsulant, a further encapsulant referred to as an "overmolding" 68 (FIG. 7) is applied over the top surface 38 of each dielectric element, so that the overmolding 68 contacts and covers at least some of the surfaces of the chip 50. In the embodiment depicted, the overmolding covers the edge surfaces 58, as well as the rear surface 56 of the chip. However, this is not essential; in a variant, the overmolding may be applied only around the edges, leaving the rear surface 56 exposed as, for example, where the rear surface is to be provided with a heat sink or other element, or where the rear surface is to be left exposed to promote heat transfer. During application of overmolding 68, the dielectric element 34 blocks spread of the overmolding onto the bottom surface 40 of the dielectric element and onto the terminals 26. As depicted in FIG. 7, the overmolding may be applied in a molding process using a pair of opposed mold parts 70 and 72 which engage opposite surfaces of the dielectric element. In a further variant, the overmolding may be applied without the use of a mold as, for example, by a "glob-top" process in which a mass of a flowable encapsulant is simply deposited over the chip, or by a controlled dispenser such as a dispenser actuated to trace around the edges of the chip and apply the encapsulant in a bead around the chip edges. The action of the dielectric layer 34 protecting the terminals 26 from contamination by the overmolding 68 facilitates use of a substantially flat lead frame. Stated another way, there is no need to provide vertical bends or jogs in the leads to position the terminals at an exposed surface of the package.

After application of the overmolding, the packages are singulated or removed from the continuous sheet or tape, as by trimming each dielectric element along its margins so as to form edges 78. These edges may be disposed near the corresponding edges 80 of the overmolding 68. Thus, the entire package may have horizontal extent equal to or only slightly larger than the horizontal extent of the overmolding, which in turn, may be only slightly larger than the horizontal extent of chip 50. The trimming operation may be performed, for example, by cutting or punching the dielectric element.

The resulting microelectronic package has a bottom surface 40 defined by the bottom surface of the dielectric element and has the terminals 26 of the original lead frame exposed at this bottom surface. Each terminal 26 is connected by a lead 28 and a wire bond 64 to one of the contacts of the chip. Each branch 24 remaining from the lead frame is "stubless." That is, each branch of the lead frame extends from the contact end 44 of a lead 28 to the terminal 26, but does not extend substantially beyond the terminal or beyond the contact end of the lead, where the lead joins a wire bond 64. This configuration minimizes RF emissions from the package and unwanted RF reception by the package. Moreover, where dielectric element 34 provides compliance, terminals 26 remain movable with respect to chip 50. The resulting package, thus, provides many of the desirable properties which can be achieved in carrier-type packages.

The package can be tested as, for example, by engaging terminals 26 with a test fixture. The compliance in the package can allow movement of terminals 26 independently of other terminals and thus facilitate engagement of all of the terminals simultaneously with the test fixture. In use, the package may be mounted on a circuit board 90 having contact pads 92 as by solder 94 or other bonding material. The mounting procedure may be performed using standard surface-mount techniques. The compliance of the package promotes movement of terminals 26 relative to chip 50 so as to compensate for differential thermal expansion and contraction of chip 50 and circuit panel 90, as may occur during the bonding process and during service. Thus, during differential thermal expansion or contraction, some or all of the contact pads 92 and the circuit board may move relative to the contacts 52 on the chip. Absent movability of terminal 26, this movement of the contact pads relative to the chip contacts would tend to cause deformation (stress) and strain in the bonding material 94 connecting the terminals 26 with the contact pads. The terminals can move under the influence of loads applied by the contact pads through the bonding material, and thus can move so as to follow at least partially the movement of the contact pads and thus reduce the stress and strain applied to the bonding material. Such compensation need not relieve all of the stress and strain in the bonding material, but desirably serves to appreciably reduce the stress and strain which would occur absent such movement. This effect tends to increase the reliability of the package, and the assembly of the package and circuit board, during thermal cycling.

Figure 9:
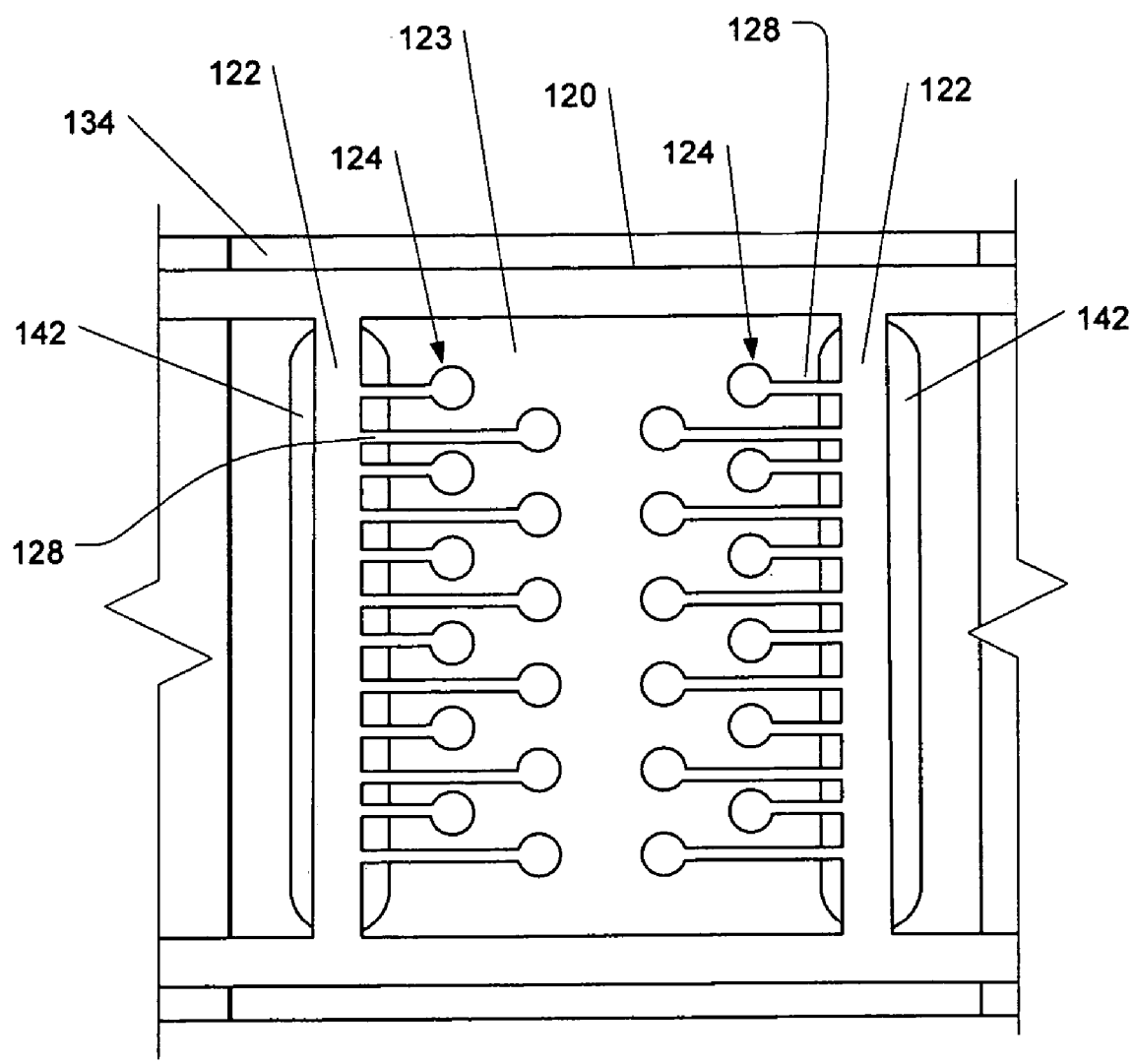
FIG. 9 is diagrammatic plan view of a laminate in accordance with a further embodiment of the invention.
Figure 10:
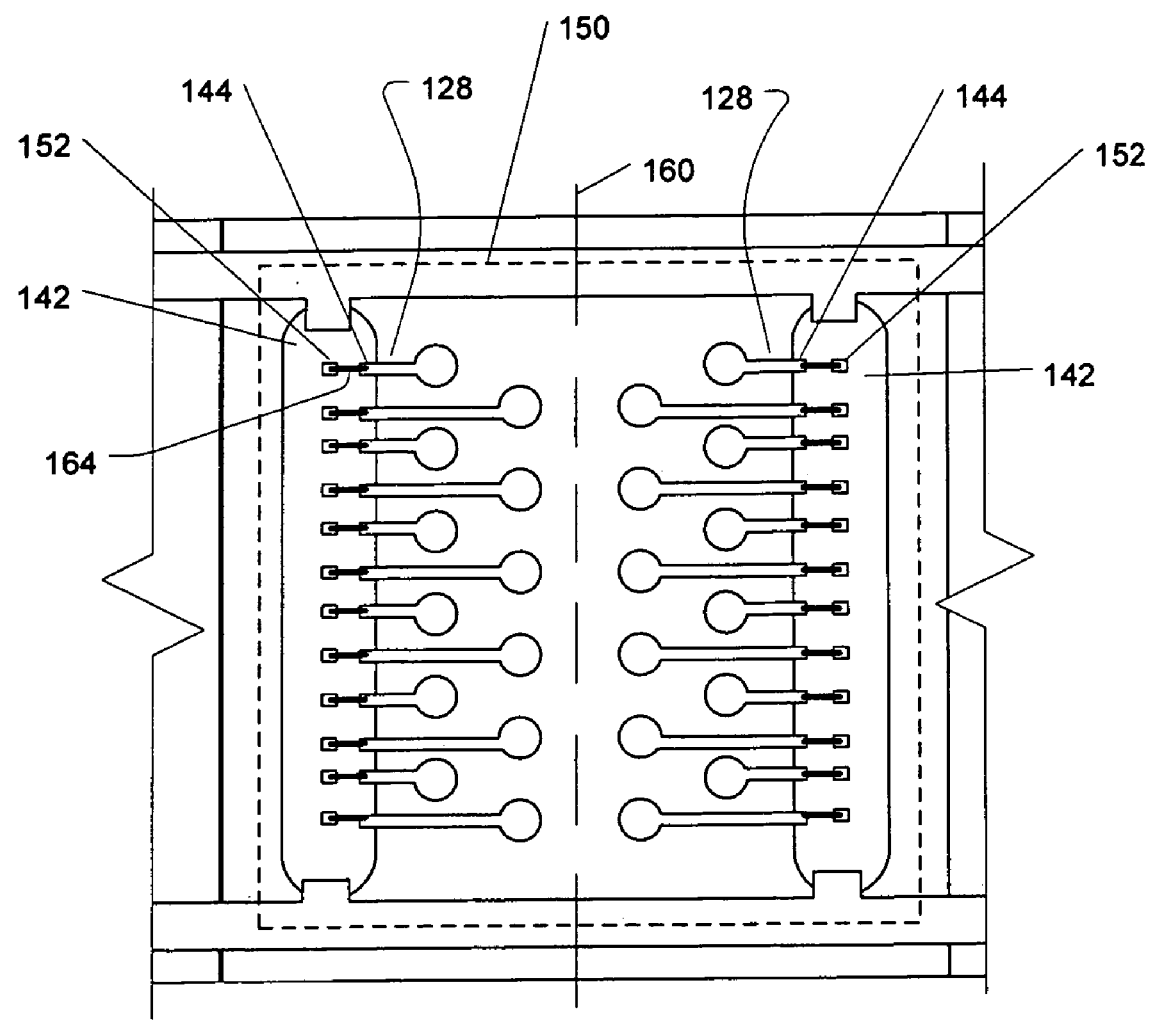
FIG. 10 is a diagrammatic plan view showing an in-process element formed from the laminate of FIG. 9 in conjunction with a microelectronic element.

In a lead frame 120 according to a further embodiment (FIG. 9), the bus element includes two parallel bus bars 122 extending on opposite sides of a central space 123, with the branches 124 associated with each bus bar 122 projecting inwardly towards the opposite bus bar, and hence into space 123. Also, the dielectric element 134 has holes 142 formed in it prior to uniting the dielectric element with the lead frame. The bus bars 122 are aligned with these preformed holes during lamination. Thus, the in-process element depicted in FIG. 9 has the bus elements aligned with the preformed holes 142 and has leads 128 projecting slightly over the holes to their respective junctures with the bus elements 122. As in the embodiment discussed with reference to FIGS. 1–8, the junctures between the leads and bus elements are severed, and the bus elements 122 are all completely or partially removed, leaving the leads with contact ends 144 projecting slightly over holes 142. After uniting the in-process element with a chip 150, the contact ends 144 of the leads can be joined to contacts 152 of the chip by wire bonds 164.

In this embodiment, the punching operation used to sever the bus elements from the leads does not form holes 142. Also, in the completed assembly, leads 128 extend horizontally inwardly, toward the medial plane 160 of the chip, so that terminals 126 are disposed closer to the medial plane than the contact ends 144. This arrangement can be used, for example, where the contacts 152 on the chip are provided in rows adjacent the periphery of the chip. In this embodiment as well, the leads and terminals are devoid of extraneous stubs left as a result of the process. Here again, the entirety of the leads and terminals are disposed in the area covered by chip 150 and entirely within the area covered by the overmolding (not shown).

Figure 11:
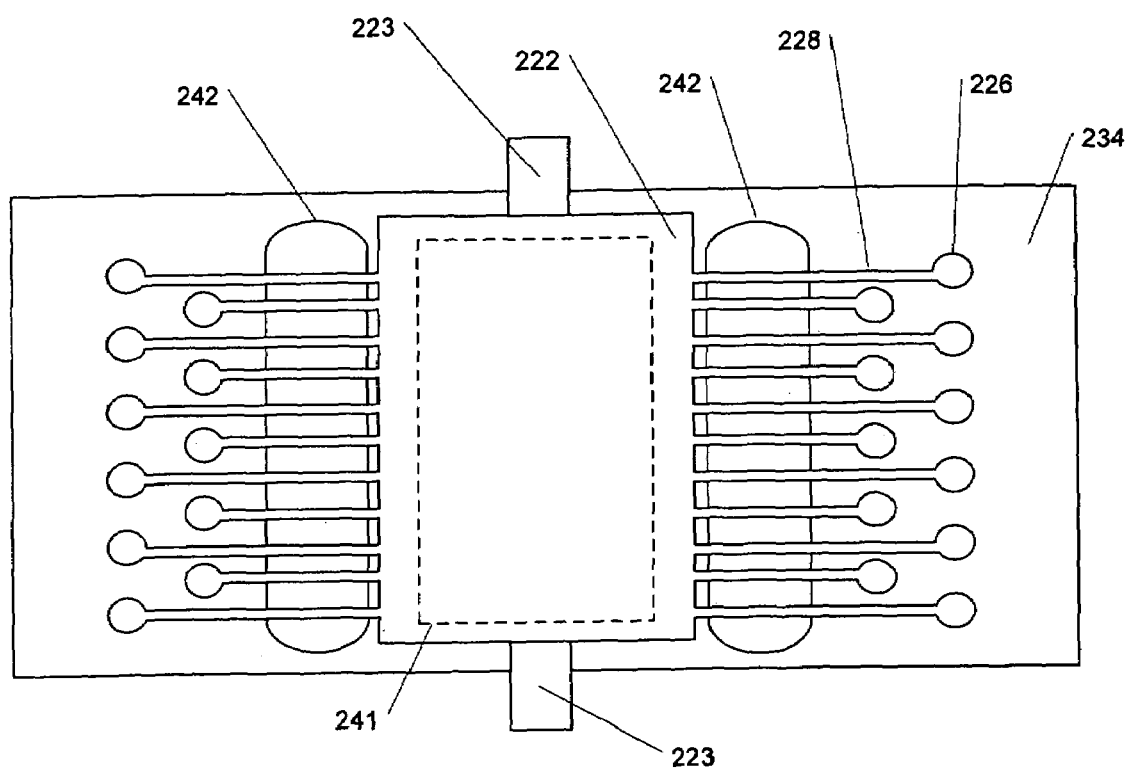
FIG. 11 is a diagrammatic plan view depicting a laminate according to yet another embodiment of the invention.
Figure 12:
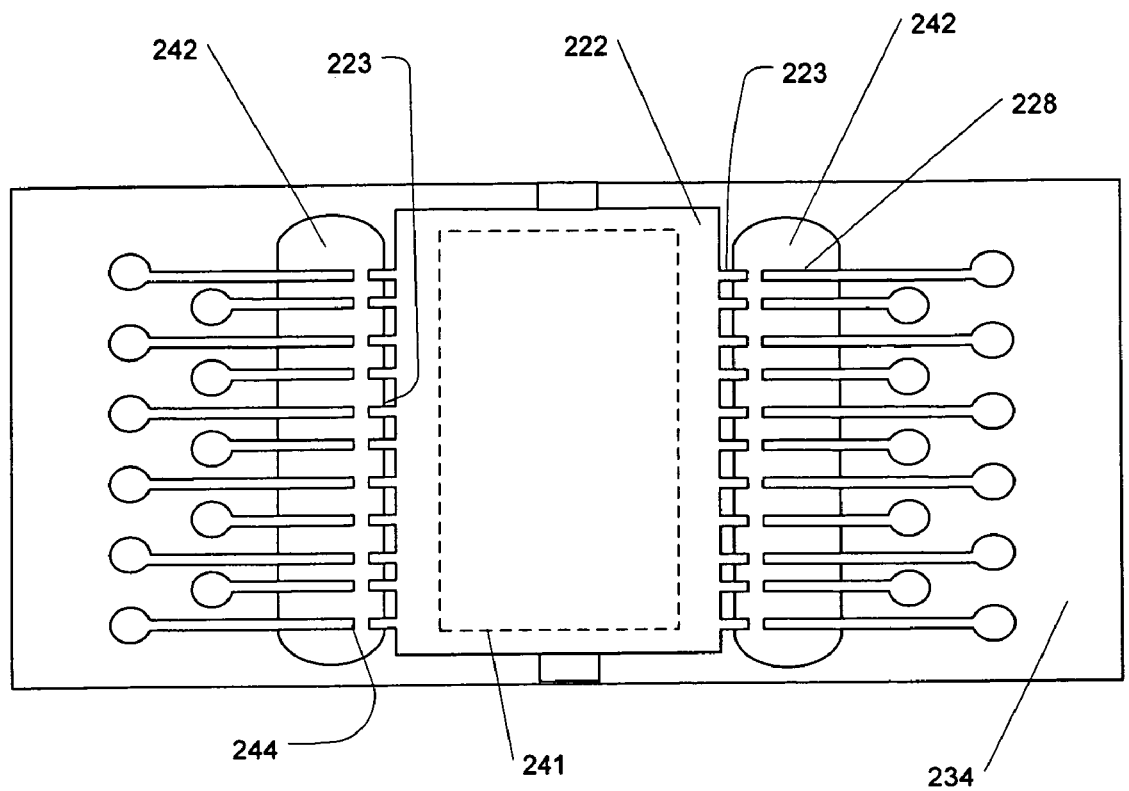
FIG. 12 is a diagrammatic plan view of the in-process element formed from the laminate of FIG. 11.
Figure 13:
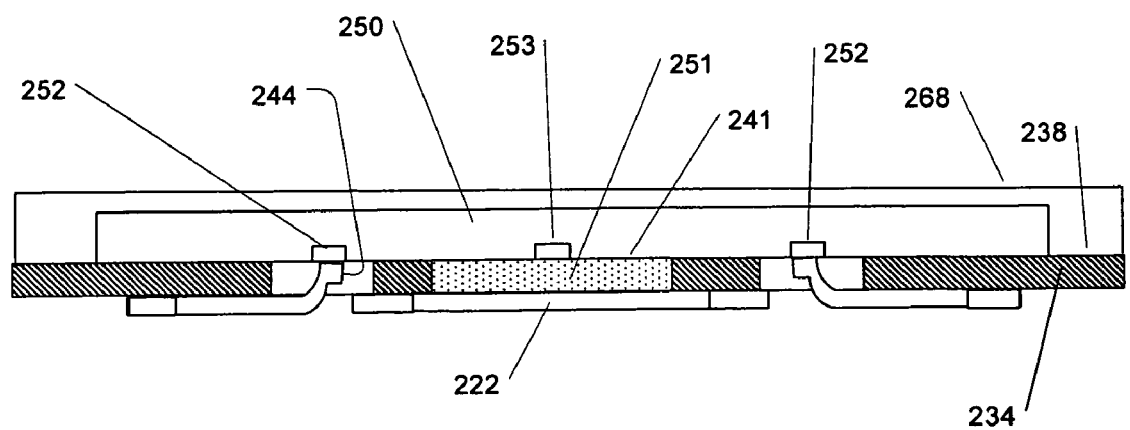
FIG. 13 is a diagrammatic section view depicting a package formed from the in-process element of FIG. 12.

In a further variant (FIG. 11), the bus element includes a large plate 222 which is connected by connecting elements 223 to the similar plates (not shown) of adjacent lead frames in the continuous sheet or strip. The leads 228 project laterally outwardly away from this large central plate to the terminals 226. Here again, preformed holes 242 are provided in the dielectric element 234 before it is united with the lead frame. The leads 228 extend across these preformed holes after lamination A further preformed opening 241 is provided in the dielectric element, and this opening is aligned with the central plate 222 during lamination. The severing operation breaks each lead 228 adjacent its juncture with plate 222, but does not remove this plate from the laminate, so that the in-process element has the configuration shown in FIG. 12. Leads 228 again project over holes 242. In the in-process element of FIG. 12, there may be small stubs 223 on the central plate 222 or bus element, but these stubs do not pose a problem in the finished assembly, inasmuch as they are connected to the central plate rather than to the signal contacts of the chip. Here again, a chip 250 (FIG. 13) is united with the in-process unit. A thermally-conductive filler 251 may be provided within opening 241 so as to thermally connect the chip with plate 222. The connecting material 251 may be a dielectric or may be electrically conductive, and hence, may electrically connect a ground connection 253 of chip 250 to the plate 222. Here again, the contact ends 244 of the individual leads, formed by the severing operation, are connected to the contacts 252 of the chip. In this instance, however, the contact ends of the lead frame are bonded directly to the contacts 252 of the chip as, for example, by sonic, ultrasonic or thermosonic bonding. In a further variant, the contact ends of the leads may be solder-bonded to the contacts on the chip or connected by other conductive bonding materials. Here again, an overmolding 268 may be applied on the top surface 238 of the dielectric element, so as to wholly or partially cover chip 250.

In yet another variant (FIGS. 14 and 15), the lead frame as initially formed includes both a central plate 322 and side bus elements 323 connected to one another by frame elements 325. The leads 328 project inwardly from the side elements 323. The dielectric element 334 has preformed openings 302 which are aligned with the junctures between the leads 328 and the side elements, and also has preformed terminal openings 304 aligned with the terminals 326 of the lead frame and a central opening 306 which is aligned with the central plate 322. In this embodiment, the leads 328 are severed from the side elements 323 of the lead frame as by punching through openings 302 after assembly of the lead frame with the dielectric element. In a further modification of this embodiment, openings 302 may be omitted in the initially provided dielectric element and may be formed by the same punching operation which severs the leads from the side elements 323.

Chip 350 is placed with its contact-bearing or front surface facing upwardly, away from the lead frame and dielectric element. Also, in this embodiment, the dielectric element 334 is positioned beneath the lead frame, so that the lead frame is disposed between the dielectric element and the rear surface 356 of the chip. The rear surface 356 may be provided with a dielectric passivation layer (not shown). Alternatively, a further dielectric element as, for example, a solder mask layer, may be provided between the lead frame and the terminals 326 and leads 328. The contact ends 344 of leads 328 project outwardly beyond the edges 358 of the chip and are connected to the contacts 352 of the chip by further lead portions, such as wire bonds 364 extending upwardly from the contact ends to the contacts 352 of the chip. In this arrangement, the entirety of the leads and contacts is not disposed beneath the chip. However, because the contact ends 344 are formed by severing prior to application of the overmold encapsulant 368, the contact ends of the leads may be disposed entirely inboard of the edges 380 defined by the overmold. Thus, the ends of the leads are not exposed at the exterior of the overmold. Here again, the leads 328 and terminals 326 do not have residual stubs. In a further variant, the side elements 323 of the lead frame are removed prior to application of the overmold.

Figure 14:
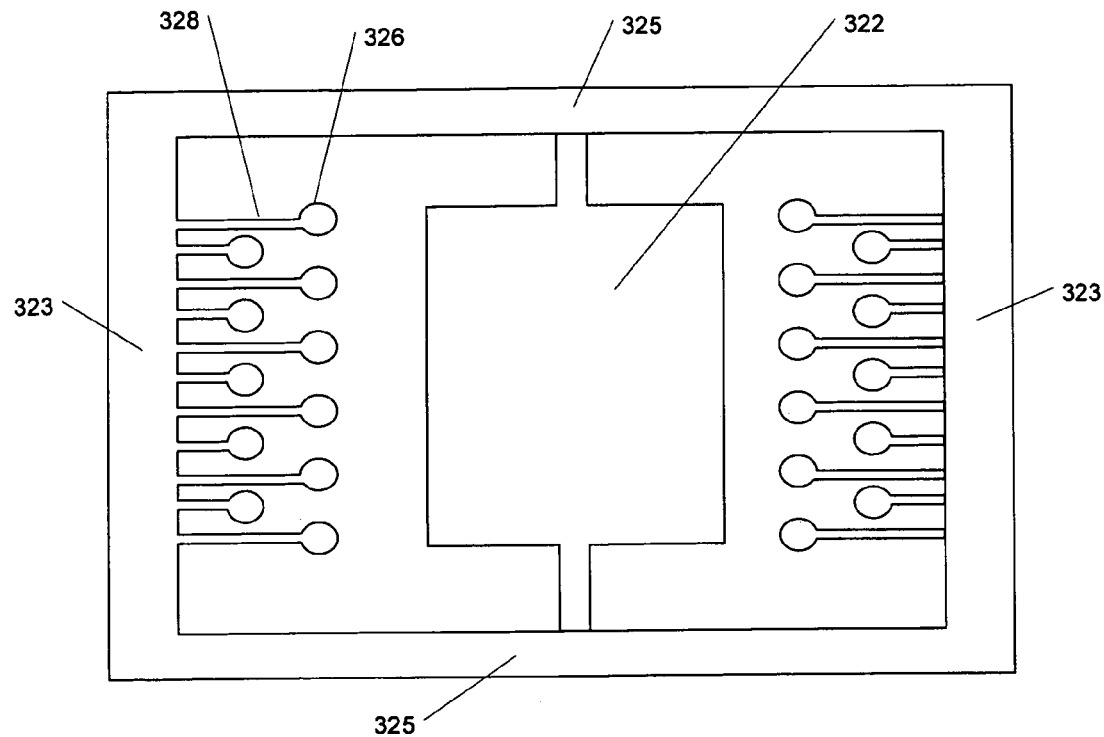
FIG. 14 is a diagrammatic plan view of a lead frame according to yet another embodiment of the invention.
Figure 15:
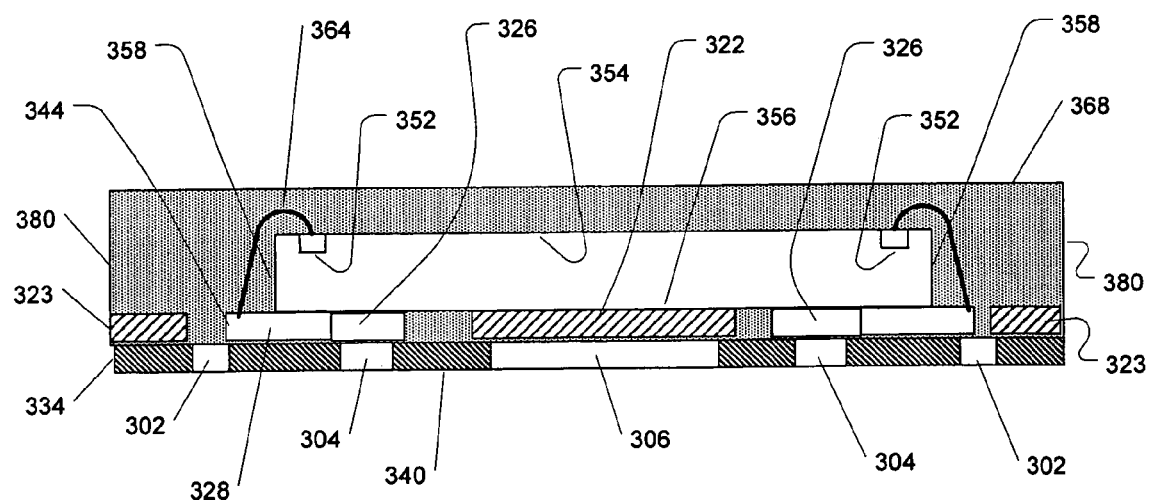
FIG. 15 is a diagrammatic sectional view depicting a package formed from the lead frame of FIG. 14.

In the embodiment of FIGS. 14 and 15, terminals 326 are exposed at the bottom surface 340 of the dielectric element 334 through holes 304. Here again, the dielectric element 334 serves to protect at least the exposed, downwardly-facing surfaces of terminals 326, leaving these surfaces free of overmolding encapsulant. Similarly, the dielectric element 334 protects the downwardly-facing surface of central plate 322. The finished package can be mounted on a circuit board or other circuit panel as discussed above. In this embodiment, central plate 322 may be bonded to a corresponding plate on the circuit panel so as to provide a thermal conduction path between the chip 350 and the circuit panel.

In a further variant, the severing operation performed prior to application of the overmolding may entirely remove portions of the dielectric element adjacent the edges of the dielectric element. However, because the severing operation is performed prior to application of the overmolding, the leads need not extend to the edges of the overmolding.

In yet another variant, the dielectric element is used as a temporary element during fabrication of the package, and then removed from the package. For example, in the embodiment of FIGS. 14 and 15, if the adhesion between the dielectric element 334 and the elements derived from the lead frame is relatively weak, the dielectric element can be peeled away from the bottom surface of the other elements of the package after application of the overmolding 368, leaving leads 328 and terminals 326 retained in place by the overmolding. Alternatively, the dielectric element can be removed by a solvent or etchant which does not attack the other components of the package. In these variants, the dielectric element serves as a carrier element maintains the elements derived from the lead frame in position after severance of the lead frame. Here again, because the lead frame need not be severed at locations outside the periphery of the overmolding, the conductive elements of final package derived from the lead frame may be disposed entirely within the area covered by the overmolding. In a further variant, a conductive element such as a metallic foil or plate can be used as a carrier element in place of the dielectric element, provided such conductive element is removed from the package.

In the embodiments discussed above, the terminals are provided as solderable terminals suitable for mounting by techniques such as surface-mounting. In further variants, the terminals may be provided as downwardly-projecting elements suitable for engagement with a socket. Also, the techniques discussed above can be utilized in fabrication of more complex packages which accommodate more than one chip per package. In such an arrangement, the lead frame would be provided with leads and terminals suitable for connection to a multiplicity of chips. Alternatively or additionally, microelectronic elements other than semiconductor chips as, for example, integrated passive devices having chip-like configurations or discrete passive devices can be mounted using the techniques discussed above.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A method of making a microelectronic package comprising:
    (a) providing a lead frame including at least one bus element and a plurality of branches extending from said bus element, each said branch including a terminal and an elongated lead extending between the bus element and the terminal;
    (b) applying a carrier element to said lead frame to form a laminate with said branches adhering to a first surface of said carrier element;
    (c) severing said branches from said bus element, leaving said branches mechanically connected to one another by said carrier element so as to form an in-process unit; assembling a microelectronic element with said in-process unit so that said microelectronic element overlies a second surface of said carrier element.

2. A method as claimed in claim 1 wherein the assembling said microelectronic element with said in-process unit step comprises coupling said microelectronic element with the second surface of said carrier element.

3. A method as claimed in claim 2 wherein said assembling step is performed so that said microelectronic element overlies at least some of said leads and terminals.

4. A method as claimed in claim 3 wherein said carrier element is a dielectric element and said assembling step is performed so that said dielectric element is disposed between said microelectronic element and said leads and terminals.

5. A method as claimed in claim 3 wherein said carrier element is a dielectric element.

6. A method as claimed in claim 2 further comprising applying an encapsulant during or after said assembling step so that the encapsulant at least partially covers the microelectronic element.

7. A method as claimed in claim 6 wherein said carrier element protects said terminals from contact with said encapsulant during said applying step.

8. A method as claimed in claim 7 further comprising the step of removing said carrier element after applying said encapsulant.

9. A method as claimed in claim 7 wherein said severing step includes punching the laminate so as to remove portions of the lead frame.

10. A method as claimed in claim 9 wherein said dielectric element has a hole therein prior to said punching step and said punching step is performed so as to remove portions of said lead frame aligned with said hole.

11. A method as claimed in claim 9 wherein said punching step is performed so as to remove portions of the dielectric element and portions of the lead frame aligned therewith and thereby form a hole in said dielectric element.

12. A method as claimed in claim 9 wherein said punching step is performed so as to remove said bus element from the laminate during formation of the in process unit.

13. A method as claimed in claim 9 wherein said punching step is performed so as to leave at least a part of said bus element in the in-process unit.

14. A method as claimed in claim 1 wherein after the assembling step said carrier element is disposed between said lead frame and said microelectronic element.

15. A method as claimed in claim 1 wherein said carrier element has a hole extending from the first surface to the second surface thereof and said microelectronic element is aligned with the hole during the assembling step.

16. A method as claimed in claim 15 wherein said microelectronic element has contacts that are aligned with the hole of said carrier element during the assembling step.

17. A method as claimed in claim 16 further comprising electrically interconnecting said contacts of said microelectronic element with said leads.

18. A method as claimed in claim 17 wherein the electrically interconnecting step comprises making the electrical interconnection through the hole of said carrier element.

19. A method as claimed in claim 18 further comprising making the electrical interconnection using elongated conductive elements.

20. A method as claimed in claim 19 wherein the elongated conductive elements are wires.

21. A method as claimed in claim 17 wherein the electrically interconnecting step comprises passing said leads through the hole of said carrier element for coupling said leads with said contacts of said microelectronic element.

22. A method as claimed in claim 1 wherein said carrier element comprises a compliant layer that permits movement of at least some of said terminals relative to said microelectronic element.

* * * * *

UNITED STATES PATENT AND TRADEMARK OFFICE
CERTIFICATE OF CORRECTION

PATENT NO. : 7,202,112 B2 Page 1 of 1
APPLICATION NO. : 10/972180
DATED : April 10, 2007
INVENTOR(S) : Craig S. Mitchell and Belgacem Haba It is certified that error appears in the above-identified patent and that said Letters Patent is hereby corrected as shown below:

Column 12, line 20, "the assembling" should read -- the step of assembling --.
Column 12, line 44, "claim 7" should read -- claim 1 --.

Signed and Sealed this

First Day of July, 2008

JON W. DUDAS
*Director of the United States Patent and Trademark Office*